United States Patent [19]

Tatsumi

[11] Patent Number: 5,266,154
[45] Date of Patent: Nov. 30, 1993

[54] DRY ETCHING METHOD

[75] Inventor: Tetsuya Tatsumi, Kanagawa, Japan

[73] Assignee: Sony Corporation, Tokyo, Japan

[21] Appl. No.: 874,114

[22] Filed: Apr. 27, 1992

[30] Foreign Application Priority Data

Apr. 26, 1991 [JP] Japan .................................. 3-123029

[51] Int. Cl.$^5$ ........................................... H01L 21/00
[52] U.S. Cl. ..................................... 156/643; 156/646; 156/662; 156/345
[58] Field of Search ................. 156/643, 646, 345, 662

[56] References Cited

U.S. PATENT DOCUMENTS

| | | | |
|---|---|---|---|
| 4,427,516 | 1/1984 | Levinstein et al. | 156/643 X |
| 4,985,109 | 1/1991 | Otsubo et al. | 156/345 |

FOREIGN PATENT DOCUMENTS

| | | | |
|---|---|---|---|
| 94422 | 5/1984 | Japan | 156/345 |
| 241227 | 11/1985 | Japan | 156/345 |
| 28823 | 1/1989 | Japan | 156/345 |
| 81321 | 3/1989 | Japan | 156/345 |
| 5413 | 1/1990 | Japan | 156/345 |

*Primary Examiner*—Thi Dang
*Attorney, Agent, or Firm*—Hill, Steadman & Simpson

[57] ABSTRACT

A dry etching method whereby underlying layer selectivity and anisotropy may be prevented from deteriorating due to excessive radicals in an over-etching process. In the etching chamber of an ordinary magnetically-enhanced microwave plasma etching apparatus, the so-called ECR position at which the ECR condition is established is a very small region, where ionization current has the highest density and the most uniform direction in ECR plasma. On the downstream side of the ECR position is the after-glow region of ECR plasma with a low plasma density. According to the present invention, the etching chamber is provided on part of the inner sidewall thereof with an Si-based material layer capable of consuming halogen radicals while a lifting and lowering means is provided for varying the distance between a target wafer and the ECR position. In a just-etching process, the wafer is kept close to the ECR position so that it may be etched at a high rate in an anisotropic shape by radicals with a high density and ions with a uniform direction. In an over-etching process, the wafer is kept distant from the ECR position to bring the after-glow region into contact with the Si-based material layer, which captures excessive radicals such as F* in the form of $SiF_x$ for removal from an etching reaction system. Thus, the present invention can be applied to polysilicon gate electrode processing to improve gate insulation film selectivity.

6 Claims, 1 Drawing Sheet

DRY ETCHING METHOD

BACKGROUND OF THE INVENTION

1. Field of the Invention

The present invention relates to a dry etching method which is employed in such applications as a production of semiconductor devices. More particularly, it relates to a dry etching method whereby an underlying layer selectivity and anisotropy may be prevented from deteriorating due to excessive radicals in an over-etching process.

2. Description of the Related Art

The recent trend toward more strict design rules for such semiconductor devices as VLSIs and ULSIs requires dry etching technologies to etch target material layers with a correspondingly higher underlying layer selectivity.

For instance, processing a MOS-FET gate electrode requires etching polysilicon layers or such silicon (Si)-based material layers as polycide films by achieving high selectivity for thin gate insulation films formed of silicon oxide ($SiO_2$). Similarly, any attempt to form contacts in impurity-diffused regions formed in semiconductor substrates or in source and drain regions of PMOS transistors used as load resistance elements for SRAM requires etching the $SiO_2$ interlayer insulating film by achieving high selectivity for Si-based material layers such as silicon substrates and polysilicon layers.

However, since dry etching involves a trade-off among underlying layer selectivity, anisotropy, high etchrate, low pollution, and low damage, these requirements must be balanced against one another to an industrially allowable degree.

Conventionally, CFC (chlorofluorocarbon) gases typified by CFC 113 ($C_2Cl_3F_3$) or a mixed gas of CFC 113 and $SF_6$ with $SF_6$ added to the improve etchrate have been widely used to etch layers of material based on such silicons (Si) as single crystal silicon, polysilicon, refractory metal silicide, and polycide. Particularly, CFC-based gases, whose molecule contains F and Cl, allow etching using both a radical reaction and an ion-assisted reaction and sidewall protection using carbonaceous polymers deposited from the gaseous phase.

Meanwhile, $CHF_3$ gas, mixed gas of $CF_4$ and $H_2$, mixed gas of $C_2F_6$ and $CHF_3$, and $C_3F_8$ have been typically used to etch silicon oxide ($SiO_2$)-based material layers. The common functions of these gases include: (a) forming a C-O bond from a constituent element C on the surface of a $SiO_2$ layer and dissociating or weakening a Si-O bond, (b) forming $CF_x^+$ as an etchant for $SiO_2$, and (c) forming relatively carbon-rich plasma and thereby removing oxygen from $SiO_2$ in the form of CO or $CO_2$ while reducing the etchrate through carbonaceous polymers deposited on Si and thereby achieving a high selectivity for Si.

However, CFC-based gases, typical of etching gases for Si-based material layers, are commonly known to contribute to destruction of the earth's ozone layer and the production and use thereof are likely to be prohibited in the near future. In these circumstances, there is pressing need to find some appropriate substitutes for such depositional carbon-based gases for use in dry etching and establish the efficient application methods thereof.

In etching processes using depositional carbon-based gases to achieve anisotropy, the future trend toward more strict design rules for semiconductor devices may permit carbonaceous polymers deposited from the gaseous phase to become particle pollutants. For instance, when Si-based material layers are etched using mixed gases of CFC 113 and $SF_6$, the flow rate of CFC 113 is increased in an over-etching process in order to prevent anisotropy and underlying layer selectivity from deteriorating due to excessive radicals. However, such an attempt to increase the amount of depositional gases during etching raises the possibility of particle pollution. Likewise, any change in the composition of etching gas during etching delays stabilization of electric discharge conditions and consequently reduces controllability and throughput.

The present inventor has proposed a great number of methods of solving the above-mentioned problems. These methods fall roughly into two types: those which use other sidewall protection substance than carbonaceous polymers instead of using depositional carbon-based gases and those which improve the efficiency in formation of carbonaceous polymers to save the greatest possible amount of depositional carbon-based gases.

The former type of methods are intended to provide sidewall protection by sulfur (S) deposits, which will be formed in etching gas when the gas is composed mainly of sulfur halides with a relatively high S/X ratio, i.e. the ratio of the number of halogen (X) atoms to that of sulfur atoms.

Specifically, sulfur halides are sulfur fluorides such as $S_2F_2$, sulfur chlorides such as $S_2Cl_2$, and sulfur bromides such as $S_2Br_2$. Serving as a main etchant for Si-based material layers, the sulfur halides can form F*, Cl*, and such ions as $SF_x^+$, $SCl_x^+$, and $SBr_x^+$ and, under some conditions, promote both radical and ion assisted reactions. Unlike $SF_6$ well-known as an etching gas, the sulfur halides can deliver sulfur (S) when dissociated through electric discharge. Under some etching conditions, when a target substrate (wafer) is maintained at a temperature lower than about 90° C., the sulfur emitted will deposit on the surface thereof, producing a sidewall protection effects. When the substrate is heated after completion of the etching, the sulfur deposits will sublime immediately, avoiding the danger of inducing particle pollution.

The present inventor has also proposed methods of promoting sulfur deposition in which $H_2$, $H_2S$, silane, and other compounds capable of consuming halogen radicals are added to sulfur halides to increase the S/X ratio in an etching reaction system.

The latter type of methods are intended to etch $SiO_2$-based material layers by using higher fluorocarbon-based compounds which are highly efficient in forming carbonaceous polymers. Specifically, such fluorocarbon-based compounds are unsaturated linear compounds, saturated cyclic compounds, and unsaturated cyclic compounds. Each fluorocarbon-based gas forms a plurality of $CF_x^+$ ions and contributes to a higher etchrate. Further, fluorocarbon-based gas severs its carbon skeleton in ECR plasma and forms chemical species promoting polymerization, thus improving the efficiency of the formation of carbonaceous polymers.

The above-mentioned methods previously proposed are far more advantageous than the conventional ones in allowing clean etching. However, they have proved to require further refinement in order to improve underlying layer selectivity in an over-etching process.

For instance, when the above mentioned $S_2F_2$ is used to etch Si-based material layers in gate electrode processing, highly reactive F* acts as a main etchant, making it difficult to maintain the high etchrate for gate insulation films formed of SiO$_2$ in an over-etching process. This difficulty can be accounted for by the fact that a Si-F bond has a great bond energy of 132 kcal/mol when compared with 111 kcal/mol for an Si-O bond.

When etching SiO$_2$-based material layers with Si-based material layers as the underlying layer thereof, there is a pressing need to secure underlying layer selectivity because an Si-Si bond has a very small bond energy of 54 kcal/mol when compared with an Si-F bond or 96 kcal/mol for an Si-Cl bond. In other words, Si-based material layers are so vulnerable to attacks by F* or Cl* that they will be etched spontaneously even when irradiated with no ion.

The presence of excessive radicals in an over-etching process deteriorates not only underlying layer selectivity but also pattern anisotropy. Over-etching is accompanied by a sharp reduction in the area of target material layers, so that those radicals which have lost the binding mate thereof cause lateral migration on the surface of a target substrate (wafer) and attack the side wall of the pattern thereof, deteriorating anisotropy thereof. A polycide film, in particular, which consists of two laminated material layers with different etching properties, are likely to cause undercut and other shape defects because the lower polysilicon layer has a higher etchrate than the upper refractory metal silicide layer.

OBJECT AND SUMMARY OF THE INVENTION

It is therefore an object of the present invention to provide a dry etching method the whereby underlying layer selectivity and anisotropy may be prevented effectively from deteriorating due to excessive radicals in an over-etching process with no change in the composition of the etching gas.

The present inventor has recognized that the manner of selecting, structuring, and using an etching apparatus requires refinement in order to reduce attacks by excessive radicals in an over-etching process with no change in the composition of the etching gas. Based on this recognition, the present invention is intended to select an electron cyclotron resonance (ECR) etching apparatus capable of reducing attacks on a target substrate (wafer) by radicals by the adjusting the distance between the substrate and a so-called ECR position, provide an Si-based material layer capable of consuming part of the excessive radicals on the inner sidewall of an etching chamber on the downstream side of the ECR position, and vary the area of contact between ECR plasma and the Si-based material layer by lifting or lowering the substrate.

An ECR etching apparatus is designed to utilize a plasma which an electron circling in a magnetic field under Lorentz's force will generate by resonantly absorbing the energy of a microwave when the cyclotron angular frequency ($\omega_c$) of the electron matches the angular frequency ($\omega$) of an electric field surrounding the microwave (i.e. an ECR condition is established). The cyclotron angular frequency ($\omega_c$) is given by an equation: $\omega_c = eB/m$ (wherein "e", "m", and "B" represent the electric charge of the electron, the mass of the electron, and a magnetic flux density, respectively). For instance, when a microwave with a frequency of 2.45 GHz is introduced, the ECR condition is established at a point having, a magnetic flux density of 875 gausses ($8.75 \times 10^{-2}$ T). The point at which the ECR condition is established is termed an ECR position, usually a very small region in an ECR etching apparatus, where ion current has the highest density and the most uniform direction in the ECR plasma.

The ECR position is determined uniquely by the structure of the ECR etching apparatus, the power of the microwave, the position of a solenoid coil generating the magnetic field, the magnetic flux density, and other conditions. ECR plasma's high-density region surrounding the ECR position is also determined mostly by these conditions. While the extent of ECR plasma is somewhat limited by a target wafer, mainly the low-density after-glow region thereof is extended by an increase in the distance between the wafer and the ECR position. Accordingly, as the distance between the target wafer and the ECR position decreases, the ECR etching apparatus can etch the wafer at a higher rate in a more anisotropic shape through radicals with a higher density and ions with a more uniform direction. Conversely, as the distance increases, ions have a less uniform direction under the invluence of a divergent magnetic field while radicals with a shorter life than ions become more likely to quench before reaching the wafer, which, in turn, becomes less vulnerable to attacks by the radicals.

Based on the above-mentioned general principle of the ECR etching apparatus, the present invention provides an Si-based material layer capable of consuming radicals on the downstream side of the ECR position to reduce attacks on a target wafer by radicals more effectively when the distance between the wafer and the ECR position increases. Further, the ECR etching apparatus is provided with a mechanism for varying the distance between the target wafer and the ECR position.

The Si-based material layer is capable of capturing radicals the deteriorating underlying layer selectivity in the form of a reaction product with a high vapor pressure for removal from an etching reaction system. For instance, F*, Cl*, and H* are removed in the form of SiF$_x$, SiCl$_x$, and SiH$_x$ respectively (wherein "x" represents an integer in the range from 1 to 4).

According to the present invention, a target wafer is first brought close to the ECR position in an ECR etching apparatus, where the material layer of the wafer is etched at a high rate in an anisotropic shape by radicals with a high density and ions with a uniform direction. Since the lower end of the ECR plasma is limited by the position of the wafer, the ECR plasma will hardly contact an Si-based material layer provided on the inner sidewall of an etching chamber if the wafer is kept sufficiently close to the ECR position. Nor is the Si-based material layer likely to consume the radicals.

In an over-etching process, however, the target wafer is brought away from the ECR position to avoid as many attacks by excessive radicals as possible. As a result, not only will radicals with a short life be prevented from reaching the wafer but also the ECR plasma's after-glow region will be extended to the wafer, increasing the area of contact between the ECR plasma and the Si-based material layer and the consumption rate of radicals and therefore improving underlying layer selectivity.

As is clear from the above description, the present invention provides an ingenuous method of achieving a high underlying layer selectivity and anisotropy whereby attacks on a target wafer by excessive radicals in an over-etching process are reduced effectively by lifting or lowering the wafer and thereby varying the area of contact between the ECR plasma and the Si-based material layer provided on the inner sidewall of the etching chamber of an ECR etching apparatus. Further, the present invention involves no change in the composition of the etching gas between pre-just-etching and over-etching processes and therefore allows highly reproducible anisotropic etching under stabilized microwave discharge without reducing throughput.

Thus, the present invention is useful particularly for production of large-scale integrated and high-performance semiconductor devices designed under strict rules.

BRIEF DESCRIPTION OF THE DRAWINGS

FIGS. 1a and 1b show the state of the ECR etching apparatus in pre-just-etching and over-etching processes, respectively.

DETAILED DESCRIPTION OF THE INVENTION

The following paragraphs describe non-limitative preferred embodiment of the present invention.

Figure 1A:
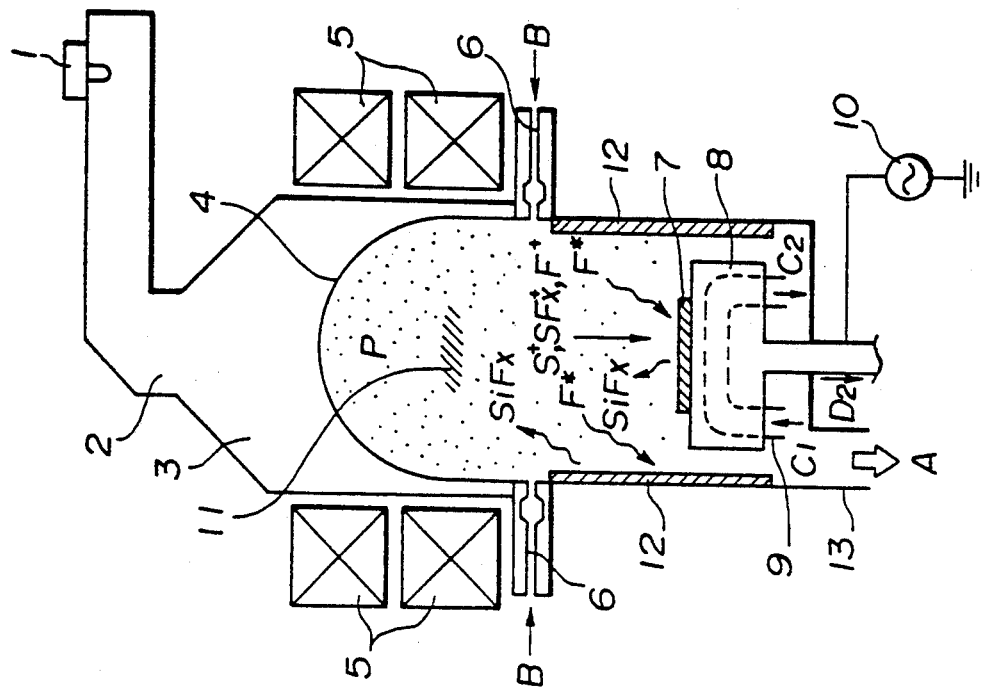
FIGS. 1a and 1b are schematic cross-sectional views showing one preferred embodiment and application of an ECR etching apparatus for a dry etching method according to the present invention, where.
Figure 1B:
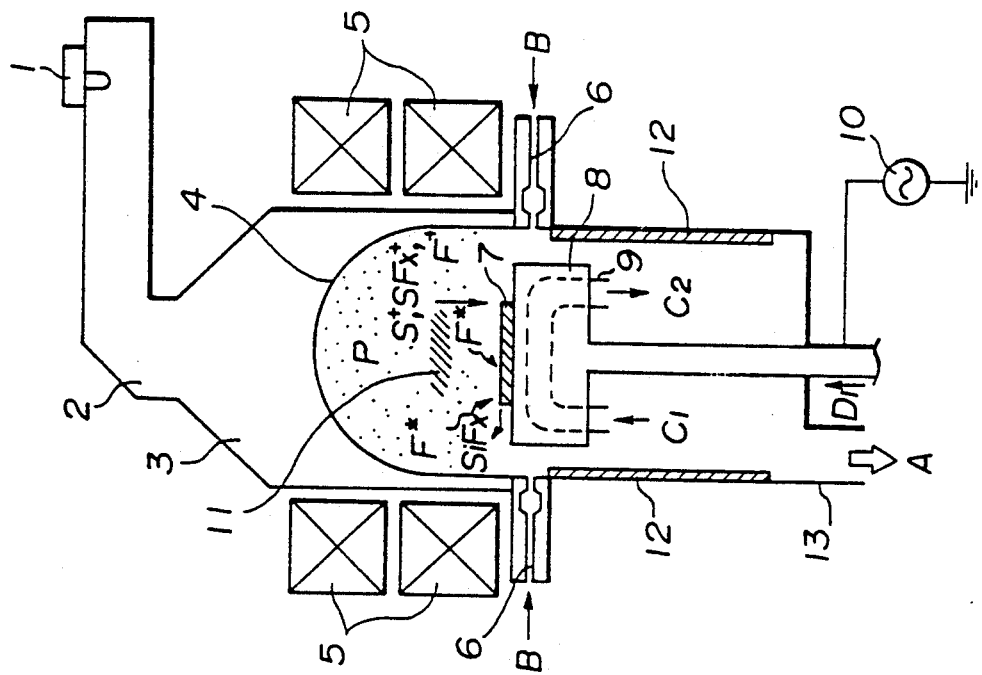

Referring now to FIGS. 1a and 1b, there is shown one example of a structure and mechanism of an RF biased magnetically-enhanced microwave plasma etching apparatus (hereinafter referred to as "ECR etching apparatus").

The ECR etching apparatus comprises a magnetron 1 for generating a microwave with a frequency of 2.45 GHz, a rectangular wave guide 2 and a circular wave guide 3 for guiding the microwave, a quartz bell jar 4 for generating ECR plasma P internally through ECR discharge using the microwave, a solenoid coil 5 adapted for circling around the circular wave guide 3 and the bell jar 4 and capable of producing a magnetic flux density of 875 gausses, a gas feed tube 6 for feeding etching gas to the bell jar 4 from the direction of arrow B in the drawings, a wafer supporting electrode 8 for supporting a wafer 7, and an RF power source 10 for applying an RF bias to the wafer supporting electrode 8. The bell jar 4 is evacuated under high vacuum by a vacuum system (not shown).

Besides the above mentioned major members, the ECR etching apparatus for use in the present invention is further provided with the following mechanisms.

First, the bell jar 4 is provided on the inner sidewall thereof below the gas feed tube 6 with an Si-based material layer 12. It is to be understood that the Si-based material layer 12 may be provided on any other position than illustrated in the drawings that is at least on the downstream side of an ECR position 11 inclusive in some cases. It is also to be understood that the Si-based material layer 12 may have a block, wafer, and other shapes of a solid body that is attached to the inner sidewall of the bell jar 4 instead of circling continuously around one longitudinal portion of the inner sidewall of the bell jar 4. The measures of providing the Si-based material layer 12 include forming an amorphous silicon or polysilicon layer directly on the inner sidewall of the bell jar 4 through chemical vapor deposition and other processes, attaching an appropriate shape of processed silicon carbide material to the inner sidewall of the bell jar 4, and attaching a dummy wafer formed of a single crystal silicon to the inner sidewall of the bell jar 4. In the preferred embodiments mentioned later, the single crystal silicon dummy wafers are used.

The wafer supporting electrode 8 is connected to a lifting and lowering means (not shown) for lifting or lowering it in the direction of arrow $D_1$ or $D_2$ respectively in the drawings, thereby varying the distance between the ECR position 11 in the ECR plasma P and the wafer 7. A cooling pipe 9 for allowing low temperature etching is buried in the supporting electrode. The cooling pipe 9 is designed to take in refrigerant fed from an external cooling facility (not shown) such as a chiller and circulate the refrigerant in the directions of arrows $C_1$ and $C_2$ in the drawings.

The following paragraphs describe one preferred embodiment of the present invention using the above mentioned ECR etching apparatus.

Referring first to FIG. 1a, in pre-just-etching processes (i.e. before a target material layer is etched in almost the thickness thereof), the wafer supporting electrode 8 is lifted in the direction of arrow $D_1$ to keep the wafer 7 close to the ECR position 11 and feed etching gas from the gas feed tube 6 to the bell jar 4, causing microwave discharge. At this time, the extent of the ECR plasma P below the ECR position 11 is limited by the wafer 7 and the wafer supporting electrode 8, so that the wafer 7 is exposed to radicals with a relatively high density and ions with a uniform direction. As a result, the wafer 7 is etched at a high rate in an anisotropic shape.

Referring then to FIG. 1b, in an over-etching process, the wafer supporting electrode 8 is lowered in the direction of arrow $D_2$ to increase the distance of the wafer 7 from the ECR position 11. At this time, the spatial position of the ECR position 11 is constant while the after-glow region of the ECR plasma P is extended to the vicinity of the surface of the wafter 7 thus lowered. In the after-glow region, radicals have a lower density while ions have a less uniform direction under the influence of a divergent magnetic field. Moreover, with the wafer 7 lowered, part of the ECR plasma P contacts the Si-based material layer 12, which captures some of radicals in the form of an Si compound with a high vapor pressure for removal from an etching reaction system via a vent 13. Thus, excessive radicals will be prevented from etching the underlying layer.

PREFERRED EMBODIMENTS

The following paragraphs describe some preferred embodiments of the present invention using the above mentioned ECR etching apparatus.

EXAMPLE 1

In one example of the present invention, it is applied to gate electrode processing in which $S_2F_2$ is used as the etching gas to etch or over-etch a polysilicon layer.

In this example, an etching sample was the wafer 7 composed of an $SiO_2$ gate insulation film formed between a single crystal silicon substrate and a polysilicon layer doped with $n^+$-type impurities, and a resist mask patterned in a predetermined shape. Referring first to FIG. 1a, the wafer 7 was set on the wafer supporting electrode 8 and kept close to the ECR position 11. The wafer 7 was also cooled to a temperature of 0° C. by ethanol refrigerant fed from the chiller through the cooling pipe 9.

In this state, the polysilicon layer was subjected to just-etching with an $S_2F_2$ flow rate of 5 SCCM, gas pressure of 1.3 Pa (10 mTorr), microwave power of 850 W, and RF bias power of 50 W (2 MHz).

F* formed by dissociation of $S_2F_2$ through electric discharge contributed to etching of the polysilicon layer while S, which is formed in the gaseous phase, is deposited on the sidewall of the pattern to produce the sidewall protection effects. In addition, $S_2F_2$ also formed such ions as $S^+$, $SF_x^+$, which fell almost perpendicularly on the wafer 7 which was kept close to the ECR position 11 and assisted a radical reaction to etch the wafer 7 at a high rate in an anisotropic shape. As a result, a gate electrode was formed in an almost perfect anisotropic shape.

Referring next to FIG. 1b, the wafer 7 was lowered to increase the distant of the wafer from the ECR position 11. The wafer 7 was then subjected to over-etching under the same conditions as mentioned above except that the RF bias power was reduced to 10 W.

At this time, F* was formed excessively because there was no specific change in $S_2F_2$ supply conditions and a reduction in the etching area of the polysilicon layer. However, F* was captured by the Si-based material layer 12 (dummy Si wafer in this example) in the form of $SiF_x$ for removal from an etching reaction system when the after-glow region of the ECR plasma P extending to the wafer 7 contacted the Si-based material layer 12 on the sidewall of the bell jar 4. As a result, the apparent S/F ratio of the etching reaction system increased to satisfy the relative requirements for sulfur deposition and allow over-etching of the polysilicon layer with a selectivity ratio maintained at about 20 for the gate insulation film.

When the wafer 7 was kept at a distance from the ECR position 11 as mentioned above, high-energy electrons making a circular motion through cyclotron resonance and produced diamagnetic effects, which interacted with a divergent magnetic field to accelerate ions in the direction of a weak magnetic field. With the RF bias power reduced to 10 W, however, the ions had less energy of incidence than when the wafer 7 was kept close to the ECR position 11. Thus, low damage was also achieved.

Incidentally, the sulfur deposits formed on the sidewall of the pattern caused no particle pollution because they sublimed immediately after completion of over-etching when the wafer 7 was heated to about 90° C.

In this example, $S_2F_2$ was used as etching gas but may be replaced by such sulfur fluorides as $SF_2$, $SF_4$, and $S_2F_{10}$ and such sulfur chlorides as $S_3Cl_2$, $S_2Cl_2$, and $SCl_2$. According to the present invention, the etching gas may contain $H_2$, $H_2S$, silane-based gas, and other additive gases capable of capturing F* for the purpose of reducing the number of radicals from an initial etching stage. In addition, the etching gas may also contain He, Ar, and other additive rare gases for the purpose of achieving sputtering, dilution, cooling, and other effects.

EXAMPLE 2

In another example of the present invention, it is applied to contact hole formation in which octafluorocyclobutane ($c-C_4F_8$) also called CFC C318 is used as the etching gas to etch or over-etch an $SiO_2$ inter-layer insulation film.

In this example, the same ECR etching apparatus is used under the same conditions as shown in FIGS. 1a and 1b except that $CF_x^+$ is formed in ECR plasma instead of $S^+$, $SF_x^+$ and $F^+$.

In this example, an etching sample was the wafer 7 composed of an $SiO_2$ inter-layer insulation film formed on a single crystal silicon substrate. Referring first to FIG. 1a, the wafer 7 was set on the wafer supporting electrode 8 and kept close to the ECR position 11. The wafer 7 was cooled to a temperature of 0° C. by ethanol regrigerant circulated through the cooling pipe 9.

In this state, the $SiO_2$ inter-layer insulation film was subjected to just-etching with a $c-C_4F_8$ flow rate of 5 SCCM, gas pressure of 1.3 Pa (10 mTorr), microwave power of 850 W, and RF bias power of 50 W (2 MHz).

Each $c-C_4F_8$ molecule formed a plurality of $CF_x^+$ particles and contributed to the higher etchrate. Further, $c-C_4F_8$ severs its carbon frames in the ECR plasma and forms chemical species promoting polymerization, thus improving the efficiency in formation of carbonaceous polymers. The thus formed carbonaceous polymers are deposited on the sidewall of the pattern, producing sidewall protection effects. As a result, a contact hole was formed in an almost perfect anisotropic shape although no depositional carbonaceous gas was added to the gas system. Further, the carbonaceous polymers also deposited on the surface of the resist mask, contributing to improved resist selectivity.

Referring next to FIG. 1b, the wafer 7 was lowered to increase the distance of the wafer from the ECR position 11. The wafer 7 was then subjected to over-etching under the same conditions as mentioned above.

At this time, F* was formed excessively but captured by the Si-based material layer 12 in the form of $SiF_x$ for removal from an etching reaction system when the area of contact between the Si-based material layer 12 and th ECR plasma P increased. As a result, the apparent C/F ratio of the etching reaction system increased to satisfy the relative requirements for carbonaceous polymer deposition and allow over-etching of the $SiO_2$ inter-layer insulation film with a selectivity ratio maintained at about 15 for the single crystal silicon substrate.

In this example, a cyclic compound $c-C_4F_8$ was used as etching gas but may be replaced by straight-chain octafluorobutene represented by the same composition formula. Further, $c-C_4F_8$ may also be replaced by saturated cyclic, unsaturated cyclic, saturated chain, or unsaturated chain higher fluorocarbon-based compounds as proposed in a series of applications by the present inventors.

What is claimed is:

1. A dry etching method comprising the steps of providing an ECR etching apparatus whose etching chamber has at least one portion of the inner sidewall thereof covered with a silicon-based material layer on a downstream side of an ECR position and which apparatus is capable of varying the distance between said ECR position and a target substrate; etching a target material layer of the target substrate with said target substrate kept relatively close to said ECR position; and then over-etching said target material layer with said target substrate being moved away from said ECR position to expose portions of the silicon-based material layer to the etching gases.

2. A dry etching method as claimed in claim 1, wherein said etching proceeds under the influence of halogen radicals.

3. A dry etching method as claimed in claim 1, wherein said target material layer is based on silicon or compound thereof.

4. A dry etching method comprising the steps of providing an ECR etching apparatus having an etching chamber having an ECR position at one end of the chamber and having silicon-based material disposed adjacent the opposite end of the chamber with a target substrate support being movable from a position adjacent the ECR position to a position exposing portions of the silicon-based material adjacent the opposite end; creating a plasma in said etching chamber and etching a material layer of the target substrate with said target substrate being in a first position relatively close to said ECR position; moving the target substrate away from said first position to expose portions of the silicon-based material to the plasma and then over-etching said target material layer.

5. A dry etching method according to claim 4, wherein the etching proceeds under the influence of halogen radicals.

6. A dry etching method according to claim 4, wherein the target material is based on a silicon or silicon compound.

* * * * *